United States Patent
Neff et al.

(10) Patent No.: US 7,630,475 B2
(45) Date of Patent: Dec. 8, 2009

(54) GAS DISCHARGE SOURCE, IN PARTICULAR FOR EUV RADIATION

(75) Inventors: Jakob Willi Neff, Kelmis (BE); Ralf Pruemmer, Geilenkirchen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/914,773

(22) PCT Filed: May 8, 2006

(86) PCT No.: PCT/IB2006/051428

§ 371 (c)(1),
(2), (4) Date: Nov. 19, 2007

(87) PCT Pub. No.: WO2006/123270

PCT Pub. Date: Nov. 23, 2006

(65) Prior Publication Data

US 2008/0187105 A1     Aug. 7, 2008

(30) Foreign Application Priority Data

May 19, 2005    (DE)    ........................ 10 2005 023 060

(51) Int. Cl.
*H05G 2/00*    (2006.01)
(52) U.S. Cl. .................... 378/119; 378/144; 250/504 R
(58) Field of Classification Search ................. 378/34, 378/119, 143, 144; 250/504 R, 492.1, 492.2, 250/493.1
See application file for complete search history.

(56) References Cited

U.S. PATENT DOCUMENTS

2004/0105082 A1    6/2004   Koshelev et al.

2007/0152175 A1*   7/2007   Moors et al. ............. 250/493.1

FOREIGN PATENT DOCUMENTS

| | | |
|---|---|---|
| DE | 10342239 A1 | 6/2005 |
| EP | 0980735 A2 | 2/2000 |
| EP | 1401248 A2 | 3/2004 |
| WO | 2004062050 A2 | 7/2004 |
| WO | 2005025280 A2 | 3/2005 |
| WO | 2005101924 A1 | 10/2005 |

OTHER PUBLICATIONS

Borisov V. M. et al: EUV Sources Using XE and SN Discharge Plasmas, Journal of Physics D. Applied Physics, IOP, vol. 37, No. 23, pp. 3254-3265, XP002328702.
Pankert J, et al: Integrating Philips Extreme UV Source in the alpha-tools, SPIE-Int. Soc. Opt. Eng. vol. 5751, No. 1, May 6, 2005, pp. 260-271, XP002398185.

* cited by examiner

*Primary Examiner*—Jurie Yun

(57) ABSTRACT

A gas discharge source for EUV radiation and/or soft X-ray radiation is arranged in a vacuum chamber and includes at least two electrodes, each with a circular periphery and rotatably mounted for rotation. At one spatial position, the electrodes have a small spacing for the ignition of a gas discharge and are each connected to a reservoir for a liquid, electrically conductive material. During rotation, a liquid film of the electrically conductive material forms over the circular periphery of the electrodes and a flow of current to the electrodes is made possible. The electrodes connect to the reservoirs via a respective connecting element, wherein a gap is formed between electrode and connecting element over a partial section of the circular periphery of each electrode. The liquid material can penetrate from the reservoir and into the gap during rotation of the electrode via a feed channel formed in the connecting element.

20 Claims, 3 Drawing Sheets

GAS DISCHARGE SOURCE, IN PARTICULAR FOR EUV RADIATION

The present invention relates to a gas discharge source, in particular for EUV radiation and/or soft X-ray radiation, in which, in a vacuum chamber, at least two electrodes with an at least approximately circular periphery are rotatably mounted for rotation, wherein the electrodes at one spatial position have a small spacing for the ignition of a gas discharge and are in each case connected to a reservoir for a liquid, electrically conductive material in such a way that, during rotation, a liquid film of the electrically conductive material can form over the circular periphery of the electrodes and a flow of current to the electrodes is made possible via the reservoirs.

The described gas discharge source is preferably used in applications in which extreme ultraviolet radiation (EUV radiation) or soft X-ray radiation in the wavelength range of approx. 1 nm to 20 nm is required, such as in EUV lithography or in metrology for example.

A generic gas discharge source is known from DE 103 42 239. Like the present invention, said document relates to a radiation source operated by means of a gas discharge, in which a hot plasma is produced by a pulsed current in an electrode system, said plasma being a source of EUV or soft X-ray radiation. The gas discharge source of said document comprises two rotatably mounted disc-shaped electrodes which are partially dipped into in each case a temperature-controlled bath containing liquid metal. By rotating the electrodes, the circular periphery of the electrodes is wetted with the liquid metal, so that, when the electrodes are rotated out of the melt, a liquid metal film forms on the peripheral surface of the electrodes. This process is similar to the production process for tin-plating wires. The layer thickness of the liquid metal on the surface of the electrodes, which is typically in the range between 0.5 and 40 µm, can be influenced by parameters such as temperature of the liquid metal, speed of rotation of the electrodes and material properties of the electrodes and of the liquid metal. The layer thickness can also additionally be set mechanically in a defined manner by a stripping mechanism. The two electrodes are arranged in such a way that at one spatial position they have a small spacing for the ignition of a gas discharge. In the region of this position, the liquid metal located on the periphery of the electrodes is evaporated by the action of a pulsed energy beam, in order to ignite a gas discharge. On account of the rotation of the electrodes, the electrode surface that is affected by the gas discharge is constantly regenerated, so that advantageously no wear occurs to the base material of the electrodes. Furthermore, the rotation of the electrodes through the metal melt means that intimate thermal contact is established with the melt, via which the electrodes which have been heated by the gas discharge can dissipate their thermal energy efficiently to the melt. The rotating electrodes therefore require no separate cooling. All that is required is for the melt to be kept at the desired temperature, above the melting temperature of the metal, by means of suitable measures. One further advantage of this generic gas discharge source is that there is a very low electrical resistance between the electrodes and the metal melt. As a result, it is readily possible to transmit very high currents to the electrodes, as are necessary in the case of the gas discharge to produce the very hot plasma suitable for radiation production. In this way, there is no need for a rotating capacitor bank which supplies the current. Rather, the current can be fed in a stationary manner via one or more feed lines from outside the metal melt and thus the electrodes. By virtue of this configuration of the gas discharge source, a long service life of the electrodes, simple cooling of the electrodes and a high efficiency in terms of radiation production are achieved.

On account of the need to have to dip the rotating electrodes into the two baths containing liquid metal during operation of the gas discharge source, the reservoirs for these baths always screen a large part of the solid angle vertically downwards. Such a radiation source therefore cannot be used for downward radiation emission. Moreover, the two reservoirs must always be arranged very close together so that the electrodes, outside the baths, come close enough together at one point to be able to ignite a plasma at this point. It may be the case that even a small amount of metal material which is exposed upon each discharge is sufficient to cause a short-circuit between the baths after a certain length of time. Moreover, the electrodes rotating in the baths give rise to waves in the liquid material, and these waves may also cause a short-circuit due to the sloshing of the material.

The object of the present invention is to further develop a generic gas discharge source in such a way that the above disadvantages are avoided.

This object is achieved by the gas discharge source according to Claim 1. Advantageous embodiments of the gas discharge source form the subject matter of the dependent claims or can be found from the following description and the examples of embodiments.

The present gas discharge source, in particular for EUV radiation and/or soft X-ray radiation, has in a vacuum chamber at least two electrodes with an at least approximately circular periphery which are rotatably mounted for rotation. The electrodes at one spatial position have a small spacing which permits the ignition of a gas discharge and are in each case connected to a reservoir for a liquid, electrically conductive material in such a way that, during rotation, a liquid film of the electrically conductive material can form over the circular periphery of the electrodes and a flow of current to the electrodes is made possible via the reservoirs. The gas discharge source is characterized in that the electrodes are in each case connected to the reservoirs via a connecting element, by means of which a gap is formed between the electrode and the connecting element over a partial section of the circular periphery of each electrode, into which gap the liquid, electrically conductive material can penetrate from the reservoir during rotation of the electrode via at least one feed channel formed in the connecting element.

In the present gas discharge source, the electrodes are preferably designed to be approximately disc-shaped. However, they may also have a different shape, provided that they have an approximately circular or annular cross section in a cross-sectional plane perpendicular to their axis of rotation, by virtue of which they can be moved through the respective reservoir in a manner comparable to a wheel. The reservoir for the liquid, electrically conductive material can preferably be temperature-controlled, so that a metal material such as tin which is preferably used can be kept at a suitable operating temperature above the melting temperature of the metal material. For temperature control purposes, suitable heating elements or heating wire may for example be integrated in the wall of the reservoir.

On account of the connecting element between the respective electrode and the associated reservoir, the respective electrodes no longer rotate freely in the bath of the liquid material. Contact is restricted to the gap between the partial section of the circular periphery of each electrode and the connecting element, preferably a metal block, as mating element.

Preferably, the connecting element also has at least one return channel for the liquid, electrically conductive material, said return channel opening into the gap. In this way, excess material can flow back into the reservoir through this return channel.

The reservoir may form part of the connecting element, wherein the connecting element must be shaped accordingly to form the reservoir. Moreover, it is possible for the connecting element or the feed channel and optionally return channel thereof to be connected to a separately arranged reservoir via special tubes. Upon rotation of the electrodes, the liquid material is transported upwards into the gap as a result of the rotation of the electrodes, wherein said liquid material forms a thin liquid film on the circular periphery of the respective electrode. The gap and/or the shape of the gap are preferably designed in such a way that this liquid film has an optimal thickness at the site of the gas discharge, at which optimal thickness the amount of evaporated liquid material does not exceed the amount required for the gas discharge. This can be set for example by the width of the gap, that is to say the spacing between the connecting element and the electrode. The gap may also taper in the rotation direction of the electrode, wherein excess material can flow back into the reservoir via the return channel. By virtue of the tapering or narrowing of the width of the gap at both ends of the gap, as provided in one embodiment of the gas discharge source, the liquid material can also be prevented from running out of the gap in the opposite direction, that is to say counter to the rotation direction. Preferably, in this case, the gap has a larger width of for example 1 mm between the two tapered ends, in order to minimize friction forces between the electrode and the connecting element. The gap can also be dimensioned in such a way that the liquid material is drawn into the gap via the feed channel and/or held in the gap by means of capillary forces.

The connecting element preferably has further channels which can be flowed through by a temperature-control fluid. This may be for example a heating fluid or a cooling fluid, for example a high-temperature oil. By means of this fluid, the connecting element can be kept at a temperature above the melting point of the electrically conductive material. Of course, it is also possible for other devices, such as electrical devices for example, to be used to control the temperature of the connecting element.

By virtue of the structure according to the invention of the present gas discharge source, the two electrodes no longer have to dip into the metal baths. Rather, the reservoirs for the electrically conductive, preferably metallic, liquid material can be positioned relatively freely, so that they no longer impair downward radiation emission. On account of the distinct spatial separation of the two reservoirs which is possible as a result, it is also no longer possible for any short-circuit to occur between the baths. At the same time, the advantages of the generic gas discharge source continue to be achieved since, during operation, the liquid material continually replaces the material evaporated from the electrodes by the gas discharge, transmits the electrical current pulses necessary for the gas discharge to the electrodes, and dissipates the heat introduced into the electrodes by the gas discharge via the connecting element.

The vacuum chamber of the gas discharge source is preferably designed in such a way that at least a basic vacuum of $10^{-4}$ hPa is achieved therein. As a result, a high voltage of for example 2 to 10 kV can be applied from a capacitor bank to the electrodes, without this leading to an uncontrolled electrical breakdown. This electrical breakdown is triggered by means of a suitable energy pulse, for example a laser pulse. The laser pulse is focussed on one of the electrodes at the narrowest point between the electrodes. As a result, part of the liquid film located on the electrodes evaporates and bridges over the electrode spacing. This leads to an electrical breakdown at this point and to a very high flow of current from the capacitor bank. This current heats the vapour of the electrically conductive material, preferably a metal vapour, to temperatures at which the latter is ionized and emits the desired EUV radiation in a pinch plasma. During operation of this radiation source, the two electrodes constantly rotate so as to continually renew the liquid film.

Preferably, the electrodes have a stepped contour on the circular periphery in cross section perpendicular to the rotation direction, wherein the contours of the two electrodes are designed in a complementary manner so that they engage in one another in the region of the smallest spacing. This interleaving means that droplets of the electrically conductive, liquid material which are formed during the gas discharge are partially recaptured by the electrodes themselves and thus do not reach the walls of the vacuum vessel or optical components of the gas discharge source.

The present gas discharge source will be explained again in more detail below with reference to examples of embodiments and in conjunction with the drawings, without restricting the scope of protection defined by the patent claims. In the drawings:

Figure 1:
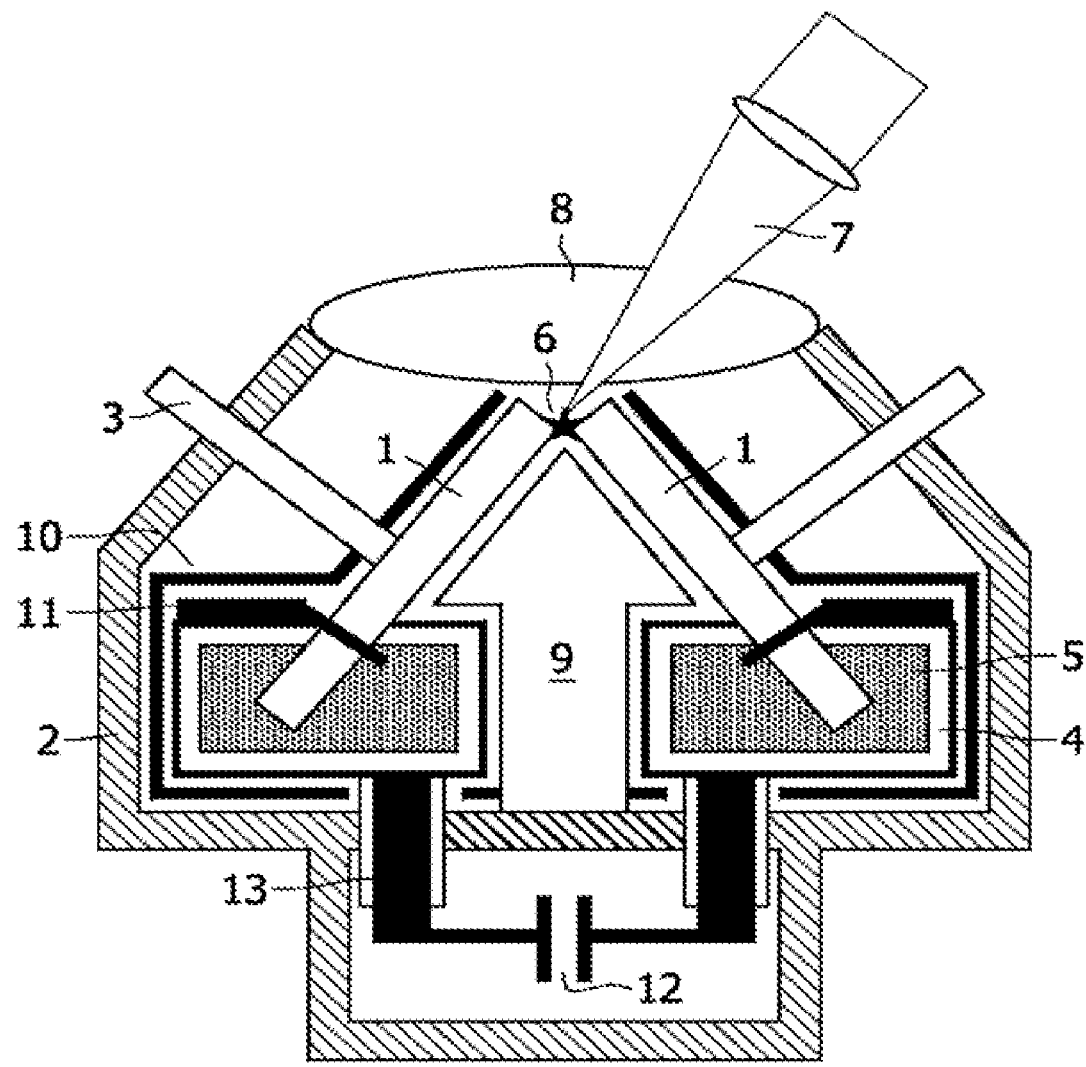
FIG. 1 shows a schematic cross-sectional diagram of a generic gas discharge source.

FIG. 1 shows the configuration of a generic gas discharge source with two rotatably mounted, disc-shaped electrodes 1 in a vacuum chamber 2. The electrodes 1 are arranged in such a way that, during rotation about their rotation axles 3, which are respectively connected to a drive for producing the rotation, they dip into two reservoirs 4 containing liquid tin 5. As a result of this rotation, a thin tin film is formed on the circular periphery of the electrodes 1. At one spatial position, the two electrodes 1 form a very short spacing, in the region of which the gas discharge 6 is ignited. This ignition is effected by means of an introduced laser pulse 7 which is focussed on a surface of the circular periphery of the electrodes 1. The figure also shows a device 8 for reducing debris, a metal screen 9 between the electrodes 1 and an external screen 10 towards the wall of the vacuum chamber 2. Strippers 11 can also be seen, which can be used to set the thickness of the liquid film on the electrodes 1. Current is supplied to the tin baths via a capacitor bank 12 and suitable insulated electrical feed lines 13.

On account of the arrangement of the two reservoirs 4 for the liquid tin 5, it is not possible for any downward radiation emission to take place in such a gas discharge source. By contrast, the present gas discharge source, as described in the following examples, permits almost free arrangement of the reservoirs within the gas discharge source, so that this disadvantage can be avoided.

Figure 2:
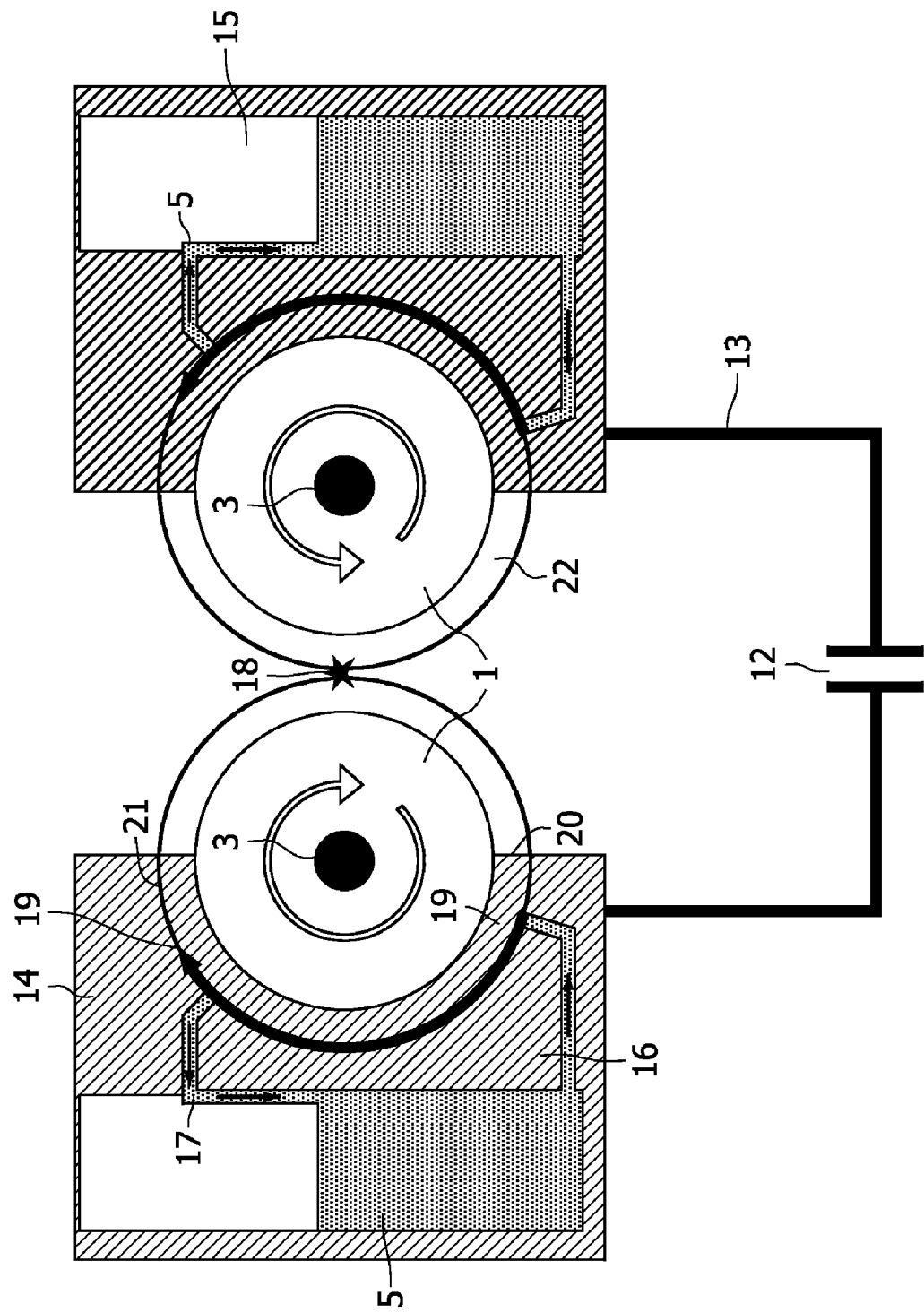
FIG. 2 shows, in cross section, one example of an electrode arrangement with the connecting elements and reservoirs in the case of a gas discharge source of the present invention.

To this end, FIG. 2 schematically shows a cross-sectional diagram according to one example of embodiment of the present gas discharge source, wherein only the two electrodes 1, the connecting elements, the reservoirs 15 and the capacitor bank 12 with the electrical feed lines 13 can be seen in the figure. The connecting elements are in each case designed as a metal block 14 with heating or cooling channels (not shown). The vacuum chamber and any screens are not shown and can be embodied in a manner already known from the aforementioned document.

In this embodiment, the two electrodes 1 are connected to the reservoirs 15 via the metal block 14, which is adapted to the circular periphery of the electrodes 1 in order to form a gap 19 between the block 14 and the electrodes 1. In the present example, the reservoir 15 is integrated in the metal block 14. The liquid, electrically conductive material, which in the present example is liquid tin 5, is transported to the gap 19 via a feed channel 16. The tin, which has a melting point of 230° C., is kept at an operating temperature of example 300° C. in the reservoir 15. On account of the rotation of the electrodes 1 about their rotation axles 3, the tin is transported upwards in the gap 19 in the rotation direction, wherein excess tin flows back into the reservoir 15 at the upper end of the gap 19 via a return channel 17. The rotation of the electrodes 1 is indicated by the arrows.

In order that the liquid tin 5 cannot run out of the gap 19, in the present example the latter is made particularly narrow at the inlet 20 and outlet 21. However, the gap 19 can have a constant thickness in the region of 1 mm between the feed channel 16 and the return channel 17, in order to keep to a minimum the friction forces between the electrode 1 and the block 14. In principle, the circulation of the liquid, electrically conductive material in the present gas discharge source may additionally be assisted by a pump. Moreover, the inlet or outlet 20, 21 may also be specially shaped so that as uniform a thickness as possible of the tin film 22 on the surface of the electrodes is achieved and thus the tin film 22 is not stripped off and lost as it runs in. The thickness of the tin film 22 can be influenced via the configuration of the outlet 21, this being important for the process of producing radiation while at the same time minimizing the evaporated amount of tin per pulse. If some tin still exits from the narrow gap 19 between the electrode 1 and the metal block 14, this can be captured and transported back to the reservoir 15.

The storage capacitors are directly connected to the metal block 14, as can be seen from FIG. 2. In this way, an electrical connection with a low resistance is ensured via the liquid tin 5 to the electrodes 1. The source point 18 for the gas discharge is in the present example defined by the focal point of a laser beam (not shown). This corresponds to the mode of operation as has already been explained in connection with the gas discharge source described in the introduction.

On account of the rotation of the two electrodes 1, the tin is carried by the surface of the electrodes 1 in the rotation direction and stripped down again to a thin film 22 by the effect of the narrow gap 19 as said electrodes are rotated out. This carrying and stripping effect can be used for example for the targeted circulation of the liquid tin in the reservoir 15, as a result of which the dissipation of heat from the electrodes 1 to the tin and from the tin to the reservoir is improved. In any case, the dissipation of heat from the electrodes 1 to the tin bath in the region of the narrow gap 19 is much better than in the generic gas discharge source of FIG. 1.

Furthermore, a pump effect which is produced by the carrying of the tin into the gap 19 can also be used to continually purify the supply of tin. For example, the return channel 17 shown in FIG. 2, through which the tin is pressed on account of the rotation of the electrodes 1 and the bottleneck effect caused by the narrowing of the gap 19 at the outlet 21, can also lead to the reservoir 15 via a diversion. For example, the return channel can pass via a filter or in the simplest case an antechamber, which retain for example oxides which float on the tin.

Figure 3:
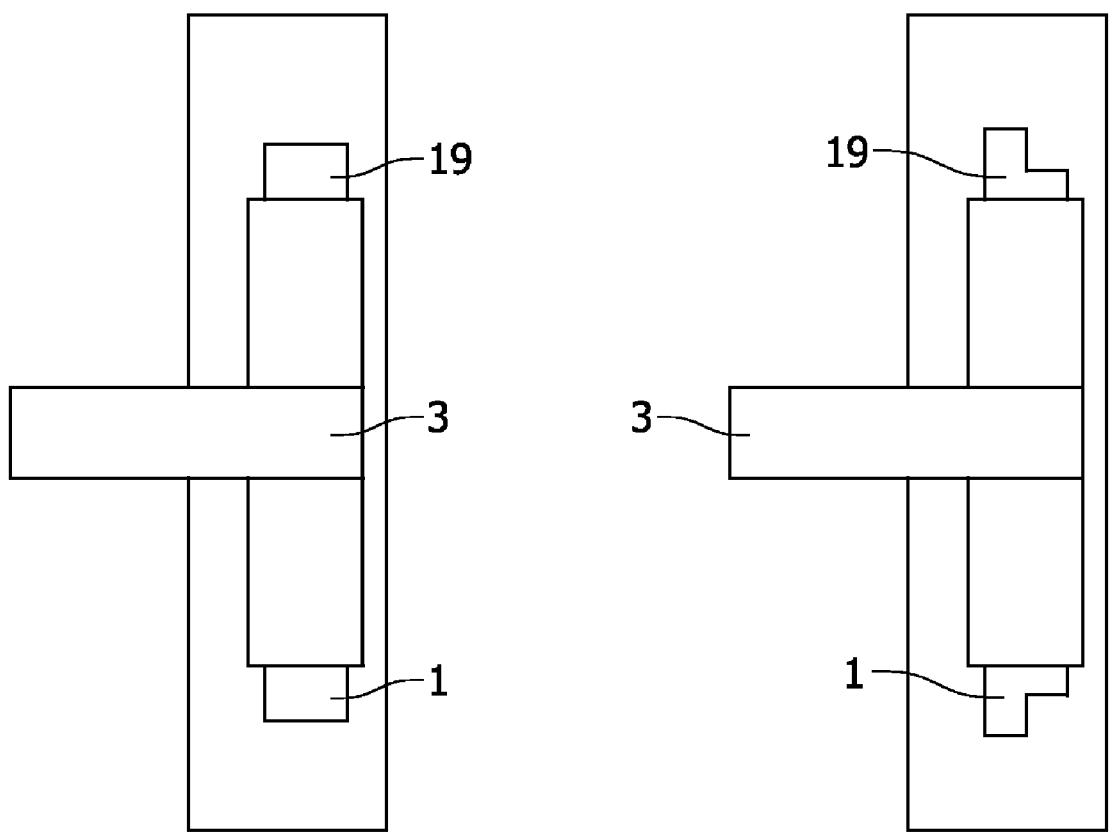
FIG. 3 shows two examples in respect of the contour of the circular periphery of the electrodes in the present gas discharge source.

FIG. 3 shows in section two differently configured disc-shaped electrodes 1, as can be used in the present gas discharge source. The figure shows a side view of the arrangement of metal block 14 and electrode 1 in cross section. The contour of the circular periphery of the electrode 1 may on the one hand be rectangular, as shown in the left-hand diagram. However, this is just one possible example. It may also be advantageous if the contour is stepped, as can be seen from the right-hand diagram. If the opposite electrode is in this case manufactured in the manner of a mirror image, an interleaved discharge gap is produced in the arrangement shown in FIG. 2. By virtue of this interleaving, droplets of tin which may arise during the gas discharge are partially recaptured by the electrodes themselves and thus do not reach the walls or other regions within the vacuum chamber.

In the gas discharge source according to the invention, the force of gravity may cause the liquid tin 5 for example to flow out of the gap 19 between the electrode 1 and the metal block 14. This can be counteracted in a contactless manner by means of magnetic forces. To this end, use is made of the fact that, due to the skin effect, alternating electromagnetic fields can produce eddy currents only in the thin tin layer. Said eddy currents, together with an applied magnetic field B, produce a Lorentz force which, given a suitable geometric configuration, counteracts the force of gravity. Such a magnetic force can also be used to control the thickness of the tin film 22 on the surface of the electrodes 1 and thus set an optimal value for plasma production. In order to amplify the magnetic forces which are intended to prevent it from being possible for tin to flow out, ferromagnetic materials can be incorporated both in certain regions of the electrodes and also the connecting elements or metal blocks. The magnetic field itself can be produced for example by means of coils and AC currents.

Another possibility for preventing tin from flowing out of the gap 19 consists in adapting the filling level of the tin in the reservoirs 15 shown in FIG. 2. Here, as shown in FIG. 2, the liquid level lies considerably above the lower region of the gap 19 in the region of the inlet 21 of the electrodes 1, so that the force of gravity exerts a certain pressure. However, the filling level can in principle also be lowered to the level of the inlet 21, so that the pressure difference disappears.

Another possibility for preventing the tin from flowing out of the gap 19 consists in using materials with suitable surface properties. For example, the surface of the electrodes 1 must be able to be wetted sufficiently in the region where the gas discharge takes place. If the surface of the metal block 14 cannot be wetted in the region which forms the surface of the gap 19 lying opposite the electrode 1, the capillary forces cannot prevent the tin from flowing out of the gap 19.

LIST OF REFERENCES

| | |
|---|---|
| 1 | electrodes |
| 2 | vacuum chamber |
| 3 | rotation axle |
| 4 | reservoir |
| 5 | liquid tin |
| 6 | gas discharge |
| 7 | laser pulse |
| 8 | device for reducing debris |
| 9 | metal screen |
| 10 | screen |
| 11 | stripper |
| 12 | capacitor bank |
| 13 | electrical feed lines |
| 14 | metal block with heating/cooling channels |

| | |
|---|---|
| 15 | reservoir |
| 16 | feed channel |
| 17 | return channel |
| 18 | source point |
| 19 | gap |
| 20 | inlet |
| 21 | outlet |
| 22 | tin film |

The invention claimed is:

1. Gas discharge source, for EUV radiation and/or soft X-ray radiation, in which, in a vacuum chamber, at least two electrodes with an at least approximately circular periphery are rotatably mounted for rotation, wherein the electrodes at one spatial position have a small spacing for the ignition of a gas discharge and are in each case connected to a reservoir for a liquid, electrically conductive material in such a way that, during rotation, a liquid film of the electrically conductive material can form over the circular periphery of the electrodes and a flow of current to the electrodes is made possible via the reservoirs, wherein the electrodes are in each case connected to the reservoirs via a connecting element, by means of which a gap is formed between the electrode and the connecting element, said gap extending over a partial section of the circular periphery of each electrode to a length which is larger than a width of the gap, into which gap the liquid, electrically conductive material can penetrate from the reservoir during rotation of the electrode via at least one feed channel formed in the connecting element.

2. The gas discharge source according to claim 1, wherein the connecting element is designed in such a way that the gap tapers in a rotation direction of the electrode.

3. The gas discharge source according to claim 1, wherein the connecting element also has at least one return channel for the liquid, electrically conductive material, said return channel opening into the gap.

4. The gas discharge source according to claim 3, wherein the return channel leads via a purification filter or a purifying antechamber into the reservoir.

5. The gas discharge source according to claim 1, wherein the gap is dimensioned in such a way that the liquid, electrically conductive material is drawn into the gap and/or held in the gap by means of capillary forces.

6. The gas discharge source according to claim 1, wherein the gap is tapered at the ends of the gap.

7. The gas discharge source according to claim 1, wherein the gap is dimensioned at least with respect to the width of the gap and shaped in such a way that the liquid film of the electrically conductive material, in the region of the small spacing of the electrodes, has a thickness at which an evaporated amount of the electrically conductive material that is required for the gas discharge is minimized for each discharge pulse.

8. The gas discharge source according to claim 1, wherein the reservoir is formed in the connecting element (14).

9. The gas discharge source according to claim 1, wherein the reservoir is connected to the feed channel in the connecting element via a supply line.

10. The gas discharge source according to claim 1, wherein the connecting element has further channels which can be flowed through by a temperature control fluid.

11. The gas discharge source according to claim 1, wherein the electrodes have a stepped contour on the circular periphery in cross section perpendicular to the rotation direction, wherein the contours of the two electrodes are designed in a complementary manner so that they engage in one another in the region of the small spacing.

12. The gas discharge source according to claim 1, wherein a magnetic device is provided which prevents the electrically conductive material from flowing out of the gap counter to a rotation direction of the electrode.

13. The gas discharge source according to claim 12, wherein ferromagnetic materials are incorporated in regions of the electrodes and/or connecting elements for amplifying magnetic forces of the magnetic device.

14. The gas discharge source according to claim 1, wherein the vacuum chamber has an opening which allows the introduction of energetic radiation for evaporating material of the liquid film in the region of the small spacing of the electrodes.

15. Gas discharge source, for EUV radiation and/or soft X-ray radiation, in which, in a vacuum chamber, at least two electrodes with an at least approximately circular periphery are rotatably mounted for rotation, wherein the electrodes at one spatial position have a small spacing for the ignition of a gas discharge and are in each case connected to a reservoir for a liquid, electrically conductive material in such a way that, during rotation, a liquid film of the electrically conductive material can form over the circular periphery of the electrodes and a flow of current to the electrodes is made possible via the reservoirs, wherein the electrodes are in each case connected to the reservoirs via a connecting element, by means of which a gap is formed between the electrode and the connecting element, said gap extending over a partial section of the circular periphery of each electrode to a length which is larger than a width of the gap, into which gap the liquid, electrically conductive material can penetrate from the reservoir during rotation of the electrode via at least one feed channel formed in the connecting element, wherein the connecting element is designed in such a way that the gap tapers in a rotation direction of the electrode, and wherein the connecting element also has at least one return channel for the liquid, electrically conductive material, said return channel opening into the gap.

16. A method of providing a gas discharge source for EUV radiation and/or soft X- ray radiation in a vacuum chamber, comprising:

rotatably mounting at least two electrodes with an at least approximately circular periphery for rotation, wherein the electrodes at one spatial position have a small spacing for the ignition of a gas discharge; and connecting each of the electrodes to a reservoir for a liquid, electrically conductive material via a connecting element in such a way that, during rotation, a liquid film of the electrically conductive material can form over the circular periphery of the electrodes and a flow of current to the electrodes is made possible via the reservoirs, wherein connecting includes forming a gap between a respective electrode and connecting element, said gap extending over a partial section of the circular periphery of each electrode to a length which is larger than a width of the gap, into which gap the liquid, electrically conductive material can penetrate from the reservoir during rotation of the electrode via at least one feed channel formed in the connecting element.

17. The method according to claim 16, wherein forming the gap includes designing the connecting element such that the gap tapers in a rotation direction of the electrode.

18. The method according to claim 16, wherein the connecting element also has at least one return channel for the liquid, electrically conductive material, said return channel opening into the gap.

19. The method according to claim 18, wherein the return channel leads via a purification filter or a purifying antechamber into the reservoir.

20. The method according to claim 16, wherein the gap is dimensioned such that the liquid, electrically conductive material is drawn into the gap and/or held in the gap by means of capillary forces.

* * * * *